(12) United States Patent
Watanabe

(10) Patent No.: US 8,527,224 B2
(45) Date of Patent: Sep. 3, 2013

(54) APPARATUS USING A BATTERY

(75) Inventor: Takeshi Watanabe, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 826 days.

(21) Appl. No.: 12/273,396

(22) Filed: Nov. 18, 2008

(65) Prior Publication Data

US 2009/0164153 A1 Jun. 25, 2009

(30) Foreign Application Priority Data

Dec. 25, 2007 (JP) ................................. 2007-333016

(51) Int. Cl.
G01R 31/36 (2006.01)

(52) U.S. Cl.
USPC .............................. 702/63; 320/131; 324/433

(58) Field of Classification Search
USPC ............................ 702/63; 320/131; 324/433
See application file for complete search history.

(56) References Cited

U.S. PATENT DOCUMENTS

| 4,619,874 A | * | 10/1986 | Skarstad et al. | 429/91 |
|---|---|---|---|---|
| 5,027,294 A | * | 6/1991 | Fakruddin et al. | 713/300 |
| 5,592,094 A | * | 1/1997 | Ichikawa | 324/427 |
| 6,157,169 A | * | 12/2000 | Lee | 320/132 |
| 6,512,984 B1 | * | 1/2003 | Suzuki et al. | 702/63 |
| 2004/0014489 A1 | * | 1/2004 | Miyachi et al. | 455/550.1 |
| 2005/0021253 A1 | * | 1/2005 | Tashiro et al. | 702/63 |
| 2006/0271315 A1 | * | 11/2006 | Cargonja et al. | 702/63 |
| 2006/0274192 A1 | * | 12/2006 | Higuchi et al. | 348/370 |

FOREIGN PATENT DOCUMENTS

JP 2007-020203 A 1/2007

* cited by examiner

Primary Examiner — Marc Armand
Assistant Examiner — Haidong Zhang
(74) Attorney, Agent, or Firm — Carter, DeLuca, Farrell & Schmidt LLP

(57) ABSTRACT

An apparatus using a battery includes a receiving unit, a determination unit and a calculation unit. The receiving unit receives a dischargeable capacity, a first voltage and a second voltage from the battery. The first voltage is used to display the end of an available time and the second voltage is used to carry out a low power operation. The determination unit determines whether the first voltage is less than the second voltage. The calculation unit corrects the dischargeable capacity and calculates the available time based on the corrected dischargeable capacity, if the determination unit determines that the first voltage is less than the second voltage.

18 Claims, 4 Drawing Sheets

APPARATUS USING A BATTERY

BACKGROUND OF THE INVENTION

1. Field of the Invention

The present invention relates to apparatuses using a battery, such as electronic still cameras or digital video cameras.

2. Description of the Related Art

A typical image capture apparatus, such as an electronic still camera or a digital video camera, includes an apparatus body that records and reproduces image data on an object, and a battery pack that is connected to the apparatus body so as to supply power thereto. The battery pack is removably mounted on the apparatus body, and can be charged with current from an external AC power adaptor.

When the battery pack is mounted on the apparatus body, an available time for which the image capture apparatus can be used by the use of the battery pack is calculated, and is displayed in a display unit of the apparatus body (for example, see Japanese Patent Laid-Open No. 2007-20203). This improves convenience, because the user can recognize how many hours (minutes) for which the user can use the apparatus for image capture and playback, in particular, when carrying the apparatus.

In some image capture apparatuses of this type, a voltage Vo and a voltage Vs are required. The end of the available time is displayed (e.g., 0 minute is displayed) when a battery voltage of the battery pack reaches the voltage Vo, and a low power operation (e.g., shutdown) is carried out when the battery voltage of the battery pack reaches the voltage Vs. In this case, the voltage Vo is usually more than or equal to the voltage Vs (Vo≧Vs).

However, in a low-temperature state or a high-power discharging state, the voltage Vo sometimes becomes less than the voltage Vs. In this case, the low power operation is suddenly started although the display shows that several minutes are left as the available time.

In this way, the image capture apparatuses as the related art are sometimes used in the environment where the available time is not accurately indicated to the user. This problem also may occur in apparatuses other than the image capture apparatuses.

SUMMARY OF THE INVENTION

The present invention is directed to overcome the above-described drawbacks and disadvantages.

The present invention indicates an available time of an apparatus using a battery to the user as accurately as possible.

The present invention indicates an available time of an apparatus using a battery to the user as accurately as possible even in a low-temperature state.

The present invention indicates an available time of an apparatus using a battery to the user as accurately as possible even in a high-power discharging state.

According to an aspect of the present invention, there is provided an apparatus using a battery. The apparatus includes a receiving unit that receives a dischargeable capacity, a first voltage and a second voltage from the battery, the first voltage being used to display the end of an available time and the second voltage being used to carry out a low power operation; a determination unit that determines whether the first voltage is less than the second voltage; and a calculation unit that corrects the dischargeable capacity and calculates the available time based on the corrected dischargeable capacity, if the determination unit determines that the first voltage is less than the second voltage.

According to another aspect of the present invention, there is provided a method for controlling an apparatus using a battery. The method includes receiving a dischargeable capacity, a first voltage and a second voltage from the battery, the first voltage being used to display the end of an available time and the second voltage being used to carry out a low power operation; determining whether the first voltage is less than the second voltage; correcting the dischargeable capacity; and calculating the available time based on the corrected dischargeable capacity, if the determination step determines that the first voltage is less than the second voltage.

Further features and aspects of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the present invention and, together with the description, serve to explain the principles of the present invention.

DETAILED DESCRIPTION OF THE EMBODIMENTS

Various exemplary embodiments, features, and aspects of the present invention will now be described in detail below with reference to the attached drawings.

First Embodiment

Figure 1:
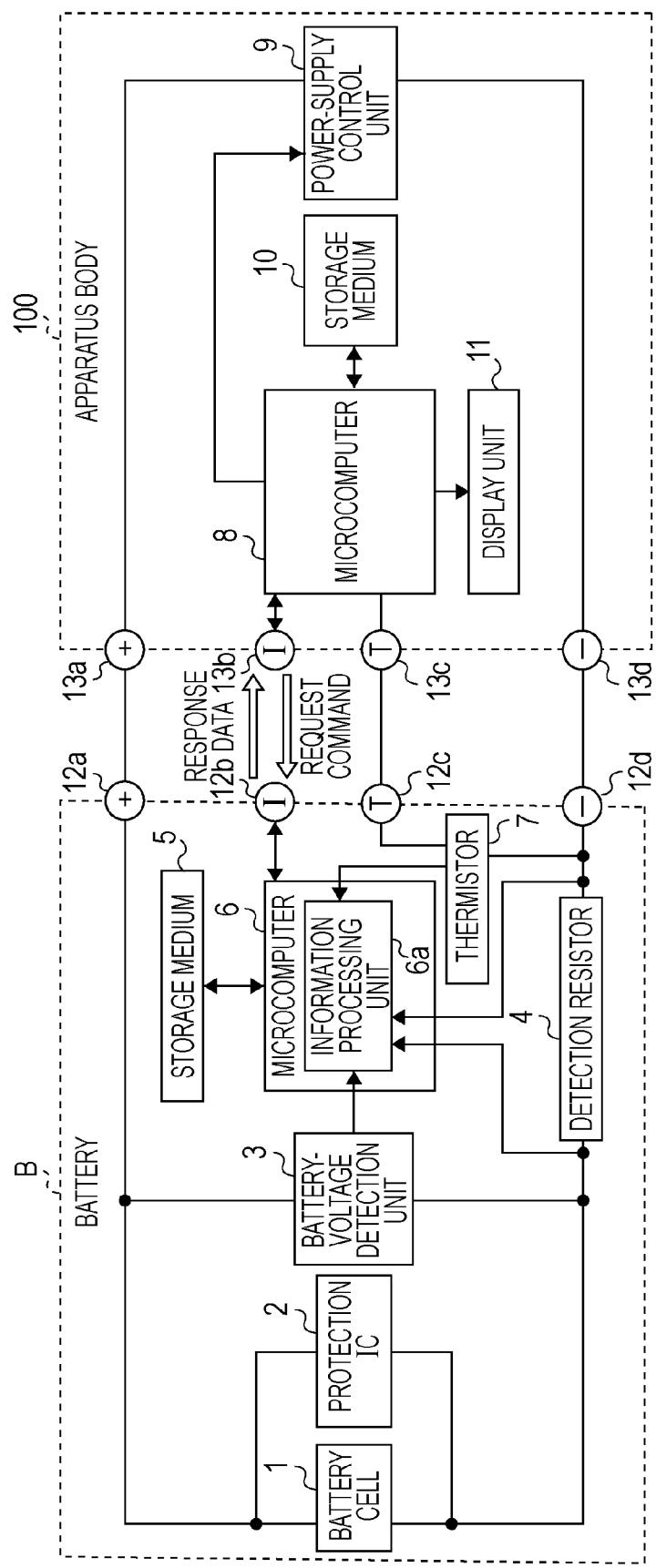
FIG. 1 shows a schematic configuration of an electronic apparatus according to an embodiment.

FIG. 1 shows a schematic configuration of an electronic apparatus according to a first embodiment. The electronic apparatus of the first embodiment can be realized by, for example, an image capture apparatus such as an electronic still camera or a digital video camera. In the electronic apparatus, a battery pack B (hereinafter simply referred to as a battery B) is removably mounted on an apparatus body 100. When the battery B is mounted on the apparatus body 100, power is supplied from the battery B to the apparatus body 100 via contacts 12a to 12d and 13a to 13d, thus activating the electronic apparatus. Also, communication between the apparatus body 100 and the battery B is enabled.

The battery B includes a battery cell 1, a protection IC 2, a battery-voltage detecting unit 3, a detection resistor 4, a storage medium 5, a microcomputer 6, and a thermistor 7. The battery cell 1 is chargeable, and generates electromotive force. The protection IC 2 controls a function of protecting the battery cell 1 during charging and discharging. The battery-voltage detecting unit 3 detects an inter-terminal voltage (battery voltage) of the battery cell 1. The detection resistor 4 detects a charging/discharging current. The storage medium 5 is used as a memory that stores battery data including an authentication code. The microcomputer 6 includes an information processing unit 6a. The thermistor 7 serves as a temperature detecting unit that detects the battery temperature. The information processing unit 6a in the microcomputer 6 converts information from the battery-voltage detecting unit 3, the detection resistor 4, and the thermistor 7 from analog to digital, and, for example, has a function of current addition.

The apparatus body 100 includes a microcomputer 8, a power-supply control unit, a storage medium 10, and a display unit 11. The microcomputer 8 controls the apparatus body 100. Although will be described in detail below, the microcomputer 8 calculates an available time for which the electronic apparatus can operate with the battery B, and displays the available time in the display unit 11. The power-supply control unit 9 generates a use voltage from power supplied from the battery B by a DC/DC converter. Further, the power-supply control unit 9 operates a charging circuit under the control of the microcomputer 8 so that the battery B is charged by the supply of current. The storage medium 10 is used as a memory that stores a plurality of power consumption information SETW beforehand in accordance with the state (e.g., operating mode) of the apparatus body 100. The display unit 11 displays the available time.

In FIG. 1, only constituent elements necessary for explanation of the first embodiment are shown, but other constituent elements are not shown.

The microcomputer 8 in the apparatus body 100 sends a request command and power consumption information SETW, which has been selectively read from the storage medium 10, to the battery B. Power consumption information SETW (mW) represents a power consumption rate of the apparatus body 100, which serves as a discharging rate of the battery B. The microcomputer 8 switches the discharging rate of the battery B in accordance with the state of the apparatus body 100.

The microcomputer 6 in the battery B calculates and corrects a dischargeable capacity GETC, a total capacity FCC, an initial capacity FCCSB, predetermined battery voltage information (including voltage Vo and voltage Vs) on the basis of power consumption information SETW received from the apparatus body 100 and the battery temperature detected by the thermistor 7.

The dischargeable capacity GETC (mAh) represents the accumulated dischargeable capacity corrected by the power consumption information SETW and the battery temperature. In other words, the dischargeable capacity GETC represents dischargeable remaining capacity remaining in the battery B, which is obtained by subtracting the capacity used in the apparatus body 100 from the total capacity FCC after charging, and correcting the difference by the power consumption information SETW and the battery temperature. The dischargeable capacity GETC changes (decreases) during operation of the apparatus body 100 with the battery B, even when the power consumption information SETW and the battery temperature do not change.

The total capacity FCC (mAh) represents the capacity chargeable in the battery cell 1 during a period from a discharging state to a charging completed state. The total capacity FCC is a variable that changes according to the charging condition and charging cycle. In other words, the total capacity FCC represents total dischargeable capacity corrected by the power consumption information SETW and the battery temperature in a full charged state. The total capacity FCC changes every time charging operation is completed. The total capacity FCC changes (decreases) during operation of the apparatus body 100 with the battery B only when the power consumption information SETW or the battery temperature changes.

The initial capacity FCCSB (mAh) represents a rating charging capacity of the battery cell 1, and is a constant value that does not change according to the charging condition and the charging cycle. Voltage Vo (V) serving as a first voltage is a capacity voltage of the battery B, and is such that the remaining capacity of the battery B becomes P % of the total capacity FCC (P is a positive number). Voltage Vx (V) serving as a second voltage is a shutoff voltage of the battery B, and is such that the remaining capacity of the battery B becomes Q % of the initial capacity FCCSB (Q is a positive number). Basically, P is more than Q. For example, P is set at 7 and Q is set at 3.

The microcomputer 6 in the battery B sends, as response data, information about the dischargeable capacity GETC, the total capacity FCC, the initial capacity FCCSB, and the predetermined battery voltage information (including voltage Vo and voltage Vs) which are corrected and calculated by the microcomputer 6 to the microcomputer 8 in the apparatus body 100.

On the basis of the dischargeable capacity GETC, the total capacity FCC, the initial capacity FCCSB, and the predetermined battery voltage information (including voltage Vo and voltage Vs) received from the battery B, the microcomputer 8 in the apparatus body 100 calculates an available time, and displays the available time in the display unit 11. The microcomputer 8 also displays a low power warning (e.g., a message that warns the user to replace the battery) and starts a low power operation (e.g., shutdown).

While data on the battery temperature is also sent from the thermistor 7 in the battery B to the microcomputer 8 in FIG. 1, it does not always need to be sent to the apparatus body 100 in the first embodiment. Even when the battery temperature is necessary to the apparatus body 100, it can be sent from the microcomputer 6 in the battery B, instead of being directly sent from the thermistor 7.

Figure 2:
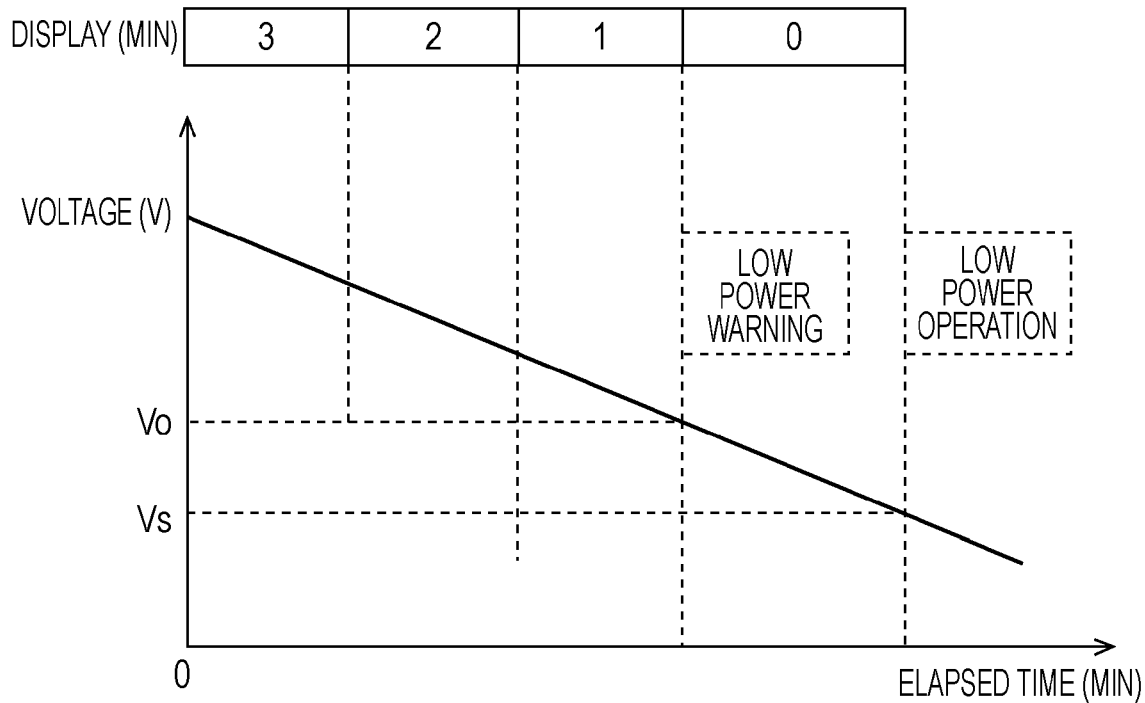
FIG. 2 shows the display of the available time and the timing of low power warning and low power operation performed by an apparatus body in the embodiment.
Figure 3:
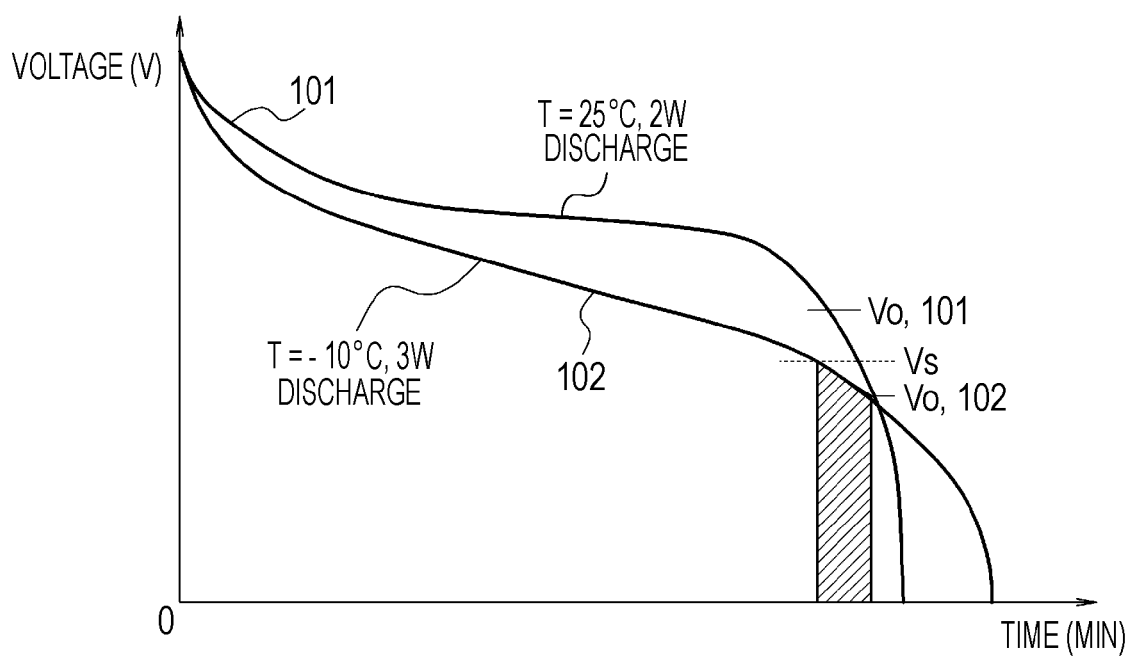
FIG. 3 shows examples of discharging characteristics of a battery.
Figure 4:
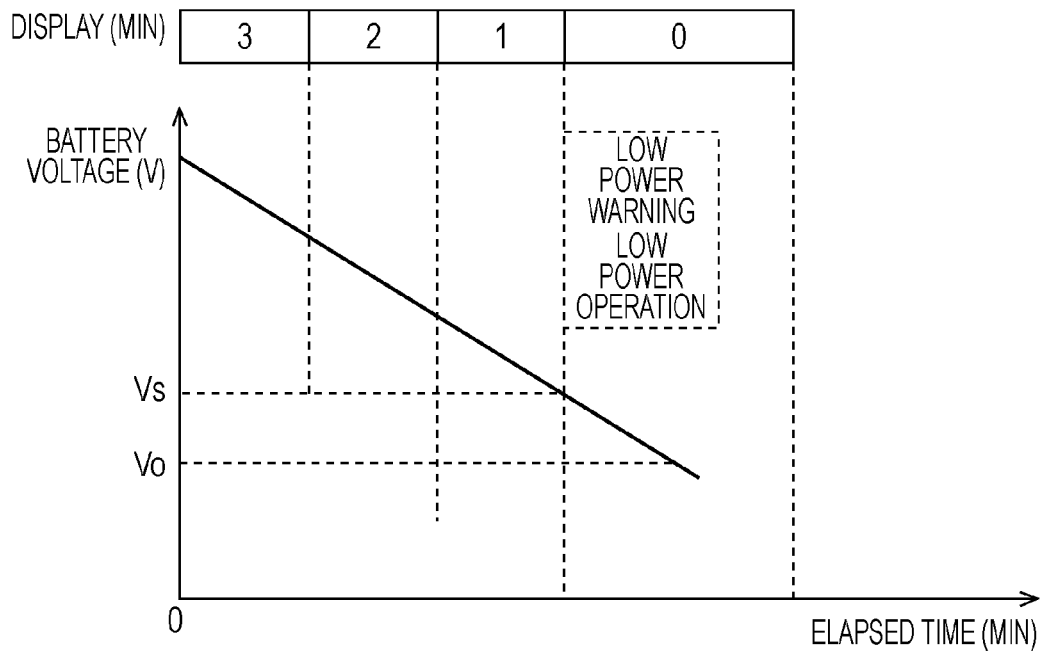
FIG. 4 shows the display of the available time and the timing of low power warning and low power operation performed by the apparatus body in the embodiment.
Figure 5:
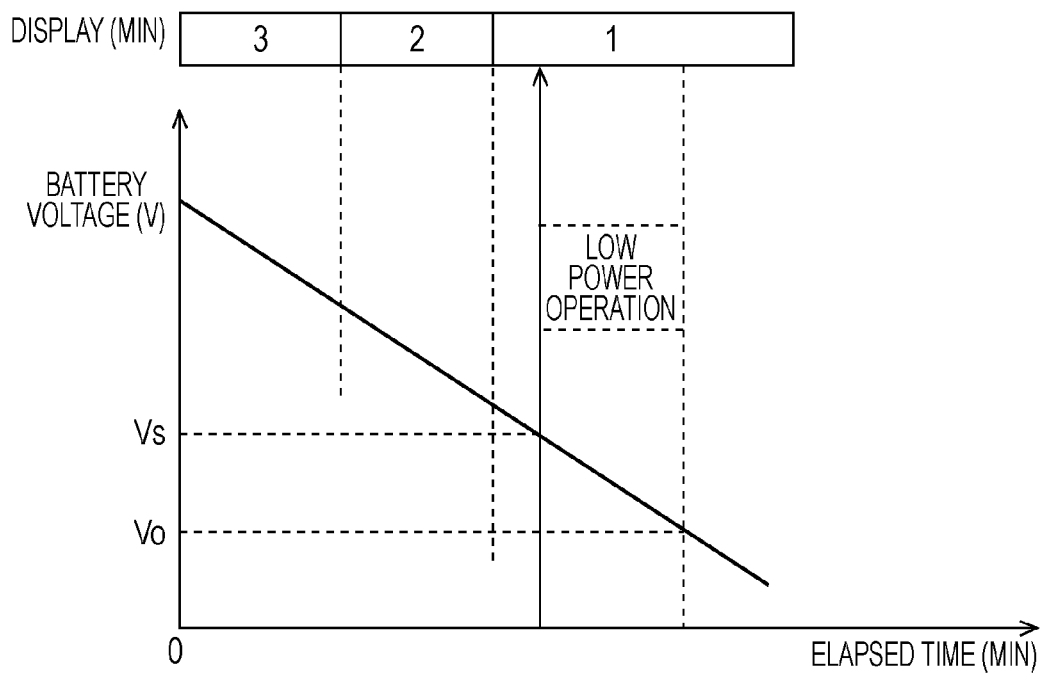
FIG. 5 shows examples of the display of the available time and the timing of low power operation.

FIGS. 2 and 4 show the display of the available time and the timing of low power warning and low power operation performed in the apparatus body 100. FIG. 3 shows examples of discharging characteristics obtained when the battery temperature of the battery B is 25° C. and the discharging rate is 2W (characteristic line 101) and when the battery temperature of the battery B is −10° C. and the discharging rate is 3W (characteristic line 102).

As shown in FIG. 2, the apparatus body 100 calculates an available time so that the end of the available time is displayed (e.g., 0 minute is displayed) when the battery voltage of the battery B decreases to the voltage Vo. The apparatus body 100 displays a low power warning when the battery voltage of the battery B reaches the voltage Vo, and starts a low power operation when the battery voltage of the battery B reaches Vs. While the end display (e.g., display of 0 minute) and the low power warning are simultaneously performed in FIG. 2, a voltage serving as the threshold value for the low power warning can be set separately.

However, while Vo (101)≧Vs when the battery temperature is 25° C. and the discharging rate is 2W, the relationship between the voltage Vo and the voltage Vs is reversed, in other words, Vo (102)<Vs, for example, when the battery temperature is −10° C. and the discharging rate is 3W, as shown in FIG. 3. In particular, the voltage Vo significantly changes according to the environmental temperature and the discharging rate, as shown in FIG. 3. This causes the phenomenon that the relationship between the voltages Vo and Vs is reversed occurs.

In this case, a low power operation is suddenly started before the end display (e.g., display of 0 minute), in other words, in a state in which several minutes are left as the available time.

In order to avoid this trouble, when the voltage Vs is more than the voltage Vo (Vo<Vs), as shown in FIG. 4, a capacity diagonally shaded in FIG. 3 is calculated, and is subtracted as correction capacity M from the remaining capacity (dischargeable capacity) to the voltage Vo, which will be described in detail below. Thus, the available time is calculated so that the end of the available time (e.g., 0 minute) is displayed when the battery voltage of the battery B reaches the voltage Vs. When the battery voltage of the battery B reaches the voltage Vs, a low power warning is given, and a low power operation is started.

Figure 6:
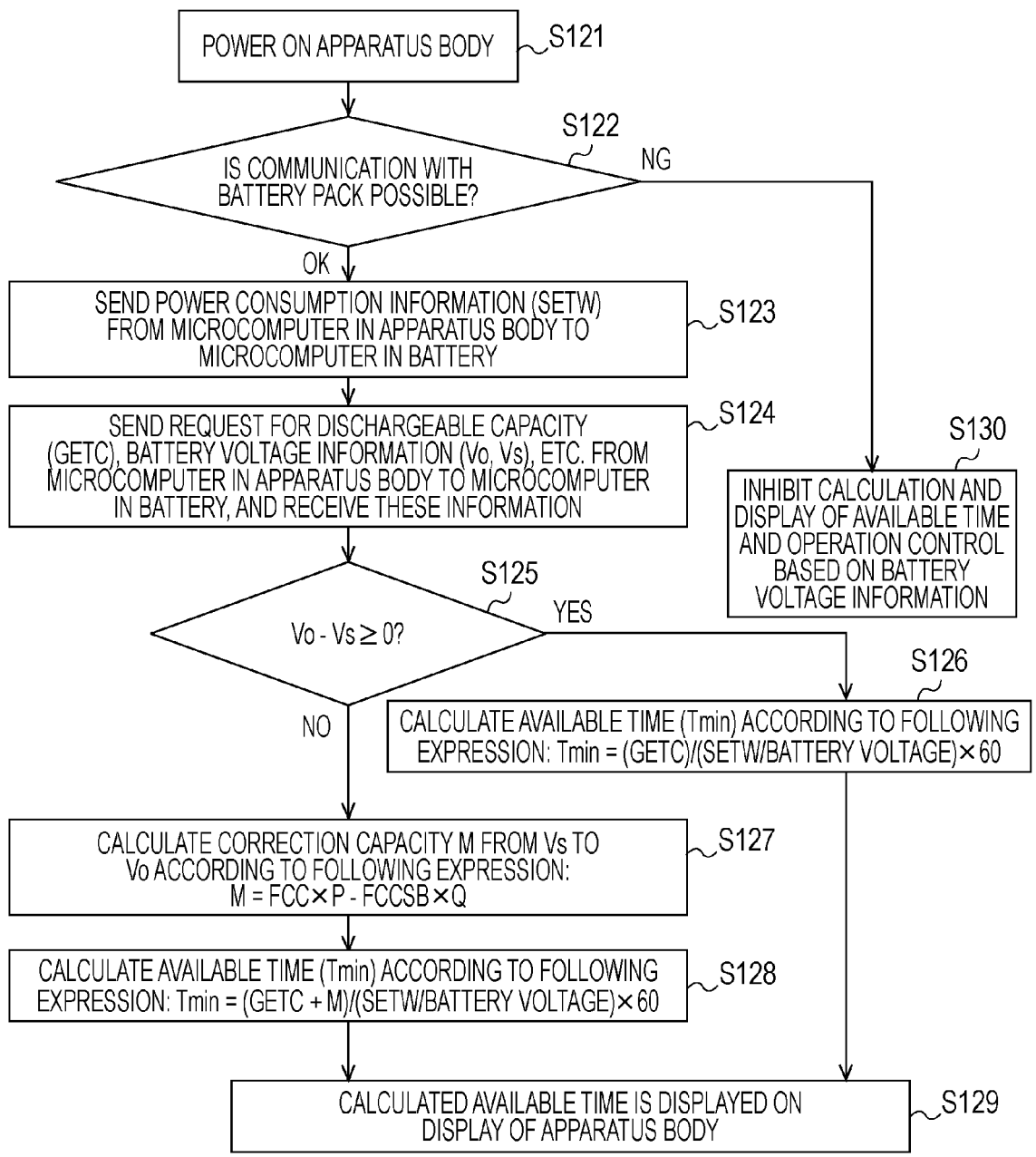
FIG. 6 is a flowchart showing a procedure performed by the apparatus body in the embodiment.

FIG. 6 is a flowchart showing a procedure performed by the apparatus body 100 in the first embodiment. The microcomputer 8 in the apparatus body 100 checks the state of a power switch (not shown). When it is detected that the power switch is turned on, the microcomputer 8 starts a power-on operation (Step S121).

Then, the microcomputer 8 determines whether communication with the microcomputer 6 in the battery B is possible (Step S122). When communication with the microcomputer 6 is not possible (NG in step S122), calculation and display of the available time and control over the apparatus body 100 according to the predetermined battery voltage information are not performed (Step S130).

When communication with the microcomputer 6 in the battery B is possible (OK in step S122), the microcomputer 8 in the apparatus body 100 selectively reads out power consumption information SETW of the apparatus body 100, from the storage medium 10, and gives the power consumption information SETW to the microcomputer 6 in the battery B (Step S123).

Then, the microcomputer 8 sends a request command to the microcomputer 6, and receives, from the battery B, the dischargeable capacity GETC, the predetermined battery voltage information (including voltage Vo and voltage Vs), etc. which are corrected on the basis of the power consumption information SETW previously sent to the battery B and the battery temperature (Step S124).

Next, the microcomputer 8 obtains a difference (Vo−Vs) between the voltage Vo and the voltage Vs received in Step S124, and determines whether Vo−Vs≧0 (Step S125).

When it is determined in Step S125 that Vo−Vs≧0 (YES in Step S125), an available time Tmin is calculated according to the following Expression (1) (Step S126):

$$T\min = [(GETC)/(SETW/\text{battery voltage})] \times 60 \quad (1)$$

In this case, the available time is calculated so that the end of the available time (e.g., 0 minute) is displayed when the battery voltage of the battery B reaches the voltage Vo, as shown in FIG. 2.

In contrast, when it is not determined in Step S125 that Vo−Vs≧0 (when Vo−Vs<0, that is, Vo<Vs) (NO in Step S125), correction capacity M from Vs to Vo is calculated according to the following Expression (2) (Step S127):

$$M = FCC \times P - FCCSB \times Q \quad (2)$$

The correction capacity M corresponds to the capacity diagonally shaded in FIG. 3. In other words, a difference between the remaining capacity at the voltage Vo and the remaining capacity at the voltage Vs is obtained.

Then, an available time Tmin is calculated according to the following Expression (3) using the correction capacity M calculated in Step S127 (Step S128):

$$T\min = [(GETC+M)/(SETW/\text{battery voltage})] \times 60 \quad (3)$$

When Vo−Vs is less than 0 (Vo<Vs), the correction capacity M is a negative value. The available time Tmin is calculated from the capacity obtained by subtracting the correction capacity M from the dischargeable capacity GETC.

Subsequently, the microcomputer 8 in the apparatus body 100 displays the available time Tmin, which is calculated in Step S126 or S128, in the display unit 11 (Step S129).

As described above, when the voltage Vo is less than the voltage Vs, the available time of the apparatus body 100 is calculated on the basis of the capacity obtained by subtracting the charging capacity of the battery B, which is provided until the voltage of the battery B changes from the voltage Vs to the voltage Vo, from the remaining capacity of the battery B. Therefore, it is possible to prevent a low power operation from being suddenly started although the display shows that the available time remains, even in a low-temperature environment and during high-power discharging.

Second Embodiment

While the algorithm of calculation of the available time is switched in accordance with the magnitude relationship between the voltage Vo and the voltage Vs in the above-described first embodiment, it can be switched in accordance with the battery temperature of the battery B. For example, when the battery temperature falls below −5° C. (predetermined value), the available time is calculated according to Expressions (2) and (3). When the battery temperature is more than or equal to −5° C., the available time is calculated according to Expression (1).

Third Embodiment

Alternatively, the algorithm of calculation of the available time can be switched in accordance with power consumption information SETW stored in the apparatus body 100. For example, when the power consumption rate (discharging rate) exceeds 6 W (predetermined value), the available time is calculated according to Expressions (2) and (3). When the power consumption rate (discharging rate) is less than or equal to 6 W, the available time is calculated according to Expression (1).

Other Embodiments

One aspect of the present invention is also achieved by supplying a storage medium, in which program codes of software for realizing the above-described functions of the exemplary embodiments are recorded, to a system or an apparatus. In this case, a computer (or a CPU or a MPU) in the system or the apparatus reads out and executes the program codes stored in the storage medium.

In this case, the program codes themselves read out from the storage medium realizes the above-described functions of the exemplary embodiments. The program codes and the storage medium storing the program codes provide one aspect of the present invention.

As the storage medium that supplies the program codes, for example, a flexible disk, a hard disk, an optical disk, a magnetooptical disk, a CD-ROM, a CD-R, a magnetic tape, a nonvolatile memory card, or a ROM can be used.

The above-described functions of the exemplary embodiments are not realized only by executing the read program codes by the computer. For example, the functions can be realized by performing one, some, or all of actual operations by an OS (a basic system or an operating system) running in the computer, according to instructions of the program codes.

Alternatively, the program codes read out from the storage medium can be written in a memory provided in a feature expansion board incorporated in the computer or a feature expansion unit connected to the computer. In this case, a CPU or the like provided in the feature expansion board or the feature expansion unit performs one, some, or all of actual operations according to instructions of the program codes that have been written in the memory, thus realizing the above-described functions of the exemplary embodiments.

While the present invention has been described with reference to the disclosed exemplary embodiments, it is to be understood that the present invention is not limited to the disclosed exemplary embodiments. The scope of the following claims is to be accorded the broadest interpretation so as to encompass all modifications, equivalent structures and functions.

This application claims the benefit of Japanese Patent Application No. 2007-333016 filed Dec. 25, 2007, which is hereby incorporated by reference herein in its entirety.

As shown in FIG. 2, the apparatus body 100 calculates an available time so that the end of the available time is displayed (e.g., 0 minute is displayed) when the battery voltage of the battery B decreases to the voltage Vo. The apparatus body 100 displays a low power warning when the battery voltage of the battery B reaches the voltage Vo, and starts a low power operation when the battery voltage of the battery B reaches Vs. While the end display (e.g., display of 0 minute) and the low power warning are simultaneously performed in FIG. 2, a voltage serving as the threshold value for the low power warning can be set separately.

What is claimed is:

1. An electronic apparatus comprising:
   a receiving unit that receives a dischargeable capacity, a first predetermined voltage and a second predetermined voltage from a battery, wherein the electronic apparatus displays a low power warning on a display unit after a battery voltage reaches the first predetermined voltage, and the electronic apparatus carries out a low power operation after the battery voltage reaches the second predetermined voltage; and
   a calculation unit that:
      calculates a difference between the first predetermined voltage and the second predetermined voltage,
      determines, using the calculated difference between the first predetermined voltage and the second predetermined voltage, whether or not the first predetermined voltage is less than the second predetermined voltage,
      corrects the dischargeable capacity if the calculation unit has determined that the first predetermined voltage is less than the second predetermined voltage,
      calculates a first available time using the corrected dischargeable capacity if the calculation unit has determined that the first predetermined voltage is less than the second predetermined voltage, and
      calculates a second available time using the dischargeable capacity if the calculation unit has determined that the first predetermined voltage is not less than the second predetermined voltage.

2. The electronic apparatus according to claim 1, wherein the electronic apparatus includes a camera.

3. The electronic apparatus according to claim 1, wherein either the first available time or the second available time is not displayed on the display unit if the electronic apparatus cannot communicate with the battery.

4. The electronic apparatus according to claim 1, wherein the electronic apparatus displays the first available time or the second available time on the display unit.

5. The electronic apparatus according to claim 1, wherein the receiving unit receives a total capacity and an initial capacity from the battery, and
   wherein the calculation unit calculates a correction capacity using the total capacity and the initial capacity if the calculation unit has determined that the first predetermined voltage is less than the second predetermined voltage, wherein the correction capacity is used to correct the dischargeable capacity.

6. The electronic apparatus according to claim 1, wherein the first predetermined voltage and the second predetermined voltage that are received from the battery are calculated by a computing device within the battery.

7. A method comprising:
   causing a receiving unit of an electronic apparatus to receive a dischargeable capacity, a first predetermined voltage and a second predetermined voltage from a battery, wherein the electronic apparatus displays a low power warning on a display unit after a battery voltage reaches the first predetermined voltage, and the electronic apparatus carries out a low power operation after the battery voltage reaches the second predetermined voltage;
   causing a calculation unit of the electronic apparatus to calculate a difference between the first predetermined voltage and the second predetermined voltage;
   causing the calculation unit to determine, using the calculated difference between the first predetermined voltage and the second predetermined voltage, whether or not the first predetermined voltage is less than the second predetermined voltage;
   causing the calculation unit to correct the dischargeable capacity if the calculation unit has determined that the first predetermined voltage is less than the second predetermined voltage;
   causing the calculation unit to calculate a first available time using the corrected dischargeable capacity if the calculation unit has determined that the first predetermined voltage is less than the second predetermined voltage; and
   causing the calculation unit to calculate a second available time using the dischargeable capacity if the calculation unit has determined that the first predetermined voltage is not less than the second predetermined voltage.

8. The method according to claim 7, wherein the electronic apparatus includes a camera.

9. The method according to claim 7, wherein either the first available time or the second available time is not displayed on the display unit if the electronic apparatus cannot communicate with the battery.

10. The method according to claim 7, wherein the electronic apparatus displays the first available time or the second available time on the display unit.

11. The method according to claim 7, further comprising:
   causing the receiving unit to receive a total capacity and an initial capacity from the battery; and
   causing the calculation unit to calculate a correction capacity using the total capacity and the initial capacity if the calculation unit has determined that the first predetermined voltage is less than the second predetermined voltage, wherein the correction capacity is used to correct the dischargeable capacity.

12. The method according to claim 7, wherein the first predetermined voltage and the second predetermined voltage that are received from the battery are calculated by a computing device within the battery.

13. A non-transitory computer-readable storage medium that stores a program for causing a computer to execute a method, the method comprising:

causing a receiving unit of an electronic apparatus to receive a dischargeable capacity, a first predetermined voltage and a second predetermined voltage from a battery, wherein the electronic apparatus displays a low power warning on a display unit after a battery voltage reaches the first predetermined voltage, and the electronic apparatus carries out a low power operation after the battery voltage reaches the second predetermined voltage;

causing a calculation unit of the electronic apparatus to calculate a difference between the first predetermined voltage and the second predetermined voltage;

causing the calculation unit to determine, using the calculated difference between the first predetermined voltage and the second predetermined voltage, whether or not the first predetermined voltage is less than the second predetermined voltage;

causing the calculation unit to correct the dischargeable capacity if the calculation unit has determined that the first predetermined voltage is less than the second predetermined voltage;

causing the calculation unit to calculate a first available time using the corrected dischargeable capacity if the calculation unit has determined that the first predetermined voltage is less than the second predetermined voltage: and causing the calculation unit to calculate a second available time using the dischargeable capacity if the calculation unit has determined that the first predetermined voltage is not less than the second predetermined voltage.

14. The non-transitory computer-readable storage medium according to claim 13, wherein the electronic apparatus includes a camera.

15. The non-transitory computer-readable storage medium according to claim 13, wherein either the first available time or the second available time is not displayed on the display unit if the electronic apparatus cannot communicate with the battery.

16. The non-transitory computer-readable storage medium according to claim 13, wherein the electronic apparatus displays the first available time or the second available time on the display unit.

17. The non-transitory computer-readable storage medium according to claim 13, wherein the method further comprises:

causing the receiving unit to receive a total capacity and an initial capacity from the battery; and causing the calculation unit to calculate a correction capacity using the total capacity and the initial capacity if the calculation unit has determined that the first predetermined voltage is less than the second predetermined voltage, wherein the correction capacity is used to correct the dischargeable capacity.

18. The non-transitory computer-readable storage medium according to claim 13, wherein the first predetermined voltage and the second predetermined voltage that are received from the battery are calculated by a computing device within the battery.

* * * * *